US009292125B2

(12) United States Patent
Kim et al.

(10) Patent No.: US 9,292,125 B2
(45) Date of Patent: Mar. 22, 2016

(54) DIGITAL FILTER, TOUCH SENSE DEVICE INCLUDING THE DIGITAL FILTER, AND METHOD FOR PERFORMING THE DIGITAL FILTERING

(71) Applicant: SAMSUNG ELECTRONICS CO., LTD., Suwon-si, Gyeonggi-do (KR)

(72) Inventors: Ki-Duk Kim, Hwaseong-si (KR); Yoonkyung Choi, Seoul (KR); Junchul Park, Daegu (KR); San-Ho Byun, Bucheon-si (KR); Minchul Lee, Yongin-si (KR); Ji-Sung Jung, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 50 days.

(21) Appl. No.: 14/185,624

(22) Filed: Feb. 20, 2014

(65) Prior Publication Data
US 2014/0240256 A1    Aug. 28, 2014

(30) Foreign Application Priority Data

Feb. 25, 2013    (KR) .................. 10-2013-0019825

(51) Int. Cl.
*G06F 3/041*    (2006.01)
*H03M 3/00*    (2006.01)
*G06F 3/044*    (2006.01)

(52) U.S. Cl.
CPC .............. *G06F 3/0416* (2013.01); *G06F 3/044* (2013.01); *G06F 3/0412* (2013.01); *H03M 3/504* (2013.01); *G06F 2203/04112* (2013.01)

(58) Field of Classification Search
CPC ...... G06F 3/0416; H03M 1/661; H03M 1/001; H03M 1/68; H03M 1/0624; H03M 3/504; G05B 2219/34292; G05B 2219/41151
See application file for complete search history.

(56) References Cited

U.S. PATENT DOCUMENTS

| 5,416,799 A | 5/1995 | Currivan et al. |
| 5,450,339 A | 9/1995 | Chester et al. |
| 5,729,574 A | 3/1998 | Suchoff et al. |
| 5,902,967 A * | 5/1999 | Teterwak .................. 178/18.01 |
| 6,427,157 B1 * | 7/2002 | Webb ............................ 708/313 |
| 7,230,975 B2 | 6/2007 | Subrahmanya et al. |
| 7,583,756 B2 | 9/2009 | Subrahmanya et al. |
| 8,149,950 B2 | 4/2012 | Kim et al. |
| 8,437,436 B2 | 5/2013 | Park et al. |
| 2003/0016742 A1 * | 1/2003 | Asahina ........................ 375/229 |
| 2004/0095951 A1 | 5/2004 | Park |

(Continued)

FOREIGN PATENT DOCUMENTS

| JP | 2009-210700 | 9/2009 |
| KR | 10-0176829 | 4/1999 |

(Continued)

*Primary Examiner* — Liliana Cerullo
(74) *Attorney, Agent, or Firm* — F. Chau & Associates, LLC

(57) ABSTRACT

A touch sensing device including digital filter is provided. The touch sensing device includes a touch panel and a touch sensor configured to sensing a touch through the touch panel. The touch sensor includes a plurality of sensing units connected to the touch panel through a plurality of sensing lines. Each of the plurality of sensing units includes a digital filter configured to generate a valid filtered value at a time and invalid filtered value at other times by performing an operation on a plurality of input digital samples and a plurality of filter coefficients.

17 Claims, 11 Drawing Sheets

(56) References Cited

U.S. PATENT DOCUMENTS

2009/0150468 A1   6/2009   Fifield
2011/0037631 A1*  2/2011   Lai et al. ................. 341/120
2012/0300960 A1* 11/2012   Mackay et al. ........... 381/119
2013/0063396 A1   3/2013   Kim et al.

FOREIGN PATENT DOCUMENTS

| KR | 10-2002-0000391 | 1/2002 |
| KR | 10-2008-0006154 | 1/2008 |
| KR | 10-2011-0077852 | 7/2011 |
| KR | 10-2013-0028629 | 3/2013 |

* cited by examiner

DIGITAL FILTER, TOUCH SENSE DEVICE INCLUDING THE DIGITAL FILTER, AND METHOD FOR PERFORMING THE DIGITAL FILTERING

CROSS-REFERENCE TO RELATED APPLICATIONS

This U.S. non-provisional patent application claims priority under 35 U.S.C. §119 to Korean Patent Application No. 10-2013-0019825, filed on Feb. 25, 2013, in the Korean Intellectual Property Office, the disclosure of which is incorporated by reference in its entirety.

TECHNICAL FIELD

The present disclosure herein relates to an electronic device, and more particularly, to a digital filter and a method for performing the digital filtering.

DISCUSSION OF THE RELATED ART

A touch sensing device is configured to recognize a touch. The touch sensing device may be used in various devices such as smart phones, tablet PCs, and user terminals. The touch sensing device may include a touch panel for outputting a signal in response to an external touch, and a touch sensor for detecting a location where the touch occurs, based on the output signal of the touch panel.

The touch sensing device may be either a capacitive type device, a resistive type device, or a transparent electrode type device. The capacitive-type touch sensing device may be equipped to recognize multiple simultaneous touches at different locations. The touch sensing device may perform a touch-sensing operation using a plurality of channels that may increase precision in the touch-sensing operation. To perform the touch-sensing operation using the plurality of channels, at least a filter may be required for each of the plurality of channels. The size of the filter may affect the complexity and size of the touch sensing device.

SUMMARY

The present disclosure provides a digital filter for performing filtering sensed signal received from a touch panel, a touch sense device including the digital filter, and a method for performing the digital filtering.

According to an exemplary embodiment of the present inventive concept, a touch sensing device is provided. Touch sensing device includes a touch panel and a touch sensor configured to control the touch panel and sense a touch signal through the touch panel. The touch sensor includes a plurality of sensing units connected to the touch panel through a plurality of sensing lines. Each of the plurality of sensing units includes a digital filter configured to generate a valid filtered value at a time and invalid filtered values at other times by performing an operation on a plurality of input digital samples and a plurality of filter coefficients. The plurality of input digital samples is generated from a signal received through each of the plurality of sensing lines.

In an embodiment of the inventive concept, each of the plurality of sensing units may include a charge amplifier, a signal processor, and an analog-to-digital converter. The charge amplifier may be configured to convert the signal received through each of the plurality of sensing lines into a voltage signal. The signal processor may be configured to process the output signal of the charge amplifier. The analog-to-digital converter may be configured to convert the output signal of the signal processor into the plurality of input digital samples.

In an embodiment of the inventive concept, the plurality of filter coefficients may be selected sequentially by a coefficient storage unit In an embodiment of the inventive concept, the digital filter may include a multiplier, an adder; and a delayer. The multiplier may be configured to multiply each of the plurality of input digital samples and each of the plurality of filter coefficients. The adder may be configured to add the output signal of the multiplier and a delayed signal generated by delaying the output signal of the adder. The delayer may be configured to delay the output signal of the adder and output the delayed signal.

In an embodiment of the inventive concept, the output signal of the delayer may generate the valid filtered value at a time when the number of inputted clock is the same as the number of the plurality of filter coefficients.

In an embodiment of the inventive concept, each of the plurality of sensing units may further include a sample dropper, a second multiplier, a second adder; and a second delayer. The sample dropper may be configured to ignore a first sample of the plurality of input digital samples, and output a second sample and samples following the second sample. The second multiplier may be configured to multiply each of the samples outputted from the sample dropper and each of the plurality of filter coefficients. The second adder may be configured to add the output signal of the second multiplier and a second delayed signal generated by delaying the output signal of the second adder. The second delayer may be configured to delay the output signal of the second adder and output the second delayed signal.

In an embodiment of the inventive concept, each of the plurality of sensing units may further include a second sample dropper, a third multiplier, a third adder, and a third delayer. The second sample dropper may be configured to ignore a first sample of the output signal of the sample dropper, and output a second sample of the output signal of the sample dropper, and samples following the second sample of the output signal of the sample dropper. The third multiplier may be configured to multiply each of the samples outputted from the second sample dropper and each of the plurality of filter coefficients. The third adder may be configured to add the output signal of the third multiplier and a third delayed signal generated by delaying the output signal of the third adder. The third delayer may be configured to delay the output signal of the third adder and output the third delayed signal.

In an embodiment of the inventive concept, the filter coefficients multiplied to each of the samples through the multiplier, the second multiplier, and the third multiplier may be different from each other.

In an embodiment of the inventive concept, the second delayer may generate a second valid filtered value at a time later than the time at which the delayer generates the valid filtered value.

In an embodiment of the inventive concept, the third delayer may generate a third valid filtered value at a time later than the time at which the second delayer generates the second valid filtered value.

In an embodiment of the inventive concept, each of the plurality of sensing units may further include a multiplexer and a post-processor. The multiplexer may be configured to sequentially select the output signals of the delayer, the second delayer, the third delayer. The post-processor may be configured to calculate an average of the output signals of the multiplexer.

According to an embodiment of the inventive concept, a digital filter for filtering sensed signal from a touch panel is provided. The digital filter includes a multiplier, an adder; and a delayer. The multiplier is configured to multiply each of the plurality of input digital samples and each of the plurality of filter coefficients. The adder is configured to add the output signal of the multiplier and a delayed signal generated by delaying the output signal of the adder. The delayer is configured to delay the output signal of the adder and output the delayed signal.

In an embodiment of the inventive concept, the delayer may generate a valid filtered value when the number of inputted clock is the same as the number of the plurality of filter coefficients and invalid filtered values at other times.

In an embodiment of the inventive concept, the digital filter may further include a sample dropper, a second multiplier, a second adder; and a second delayer. The sample dropper may be configured to ignore a first sample of the plurality of input digital samples, and output a second sample and samples following the second sample. The second multiplier may be configured to multiply each of the samples outputted from the sample dropper and each of the plurality of filter coefficients. The second adder may be configured to add the output signal of the second multiplier and a second delayed signal generated by delaying the output signal of the second adder. The second delayer may be configured to delay the output signal of the second adder and output the second delayed signal.

In an embodiment of the inventive concept, the digital filter may further include a second sample dropper, a third multiplier, a third adder, and a third delayer. The second sample dropper may be configured to ignore a first sample of the output signal of the sample dropper, and output a second sample of the output signal of the sample dropper, and samples following the second sample of the output signal of the sample dropper. The third multiplier may be configured to multiply each of the samples outputted from the second sample dropper and each of the plurality of filter coefficients. The third adder may be configured to add the output signal of the third multiplier and a third delayed signal generated by delaying the output signal of the third adder. The third delayer may be configured to delay the output signal of the third adder and output the third delayed signal.

In an embodiment of the inventive concept, the filter coefficients multiplied to each of the samples at the multiplier, the second multiplier, and the third multiplier may be different from each other.

In an embodiment of the inventive concept, each of the plurality of sensing units may further include a multiplexer and a post-processor. The multiplexer may be configured to sequentially select the output signals of the delayer, the second delayer, the third delayer. The post-processor may be configured to calculate an average of the output signals of the multiplexer.

According to an embodiment of the inventive concept, a method for filtering digital samples is provided. The method includes steps of initializing a sample variable and an addition variable, receiving a digital sample corresponding to the sample variable, selecting a filter coefficient corresponding to the sample variable, multiplying the digital sample by the selected filter coefficient, adding the multiplied result with the addition variable, delaying the added result, storing the delayed result to the addition variable, comparing the sample variable with a reference value. The method further includes repeating a step of increasing the sample variable and the steps of receiving a digital sample corresponding to the increased sample variable; selecting a filter coefficient corresponding to the increased sample variable, multiplying the digital sample by the selected filter coefficient; adding the multiplied result with the addition variable; delaying the added result; storing the delayed result to the addition variable, and comparing the increased sample variable with the reference value, for as long as the sample variable is less than the reference value. The method further includes outputting the addition variable as a valid filtered value when the sample variable is the same as the reference value and as invalid filtered values when the sample variable is not the same as the reference value.

In an embodiment of inventive concept, the filter coefficient may be selected by a coefficient storage unit.

BRIEF DESCRIPTION OF THE DRAWINGS

The accompanying drawings are included to provide a further understanding of the inventive concept. The drawings illustrate exemplary embodiments of the inventive concept and, together with the description, serve to explain principles of the inventive concept. In the drawings.

DETAILED DESCRIPTION OF THE EMBODIMENTS

Figure 1:
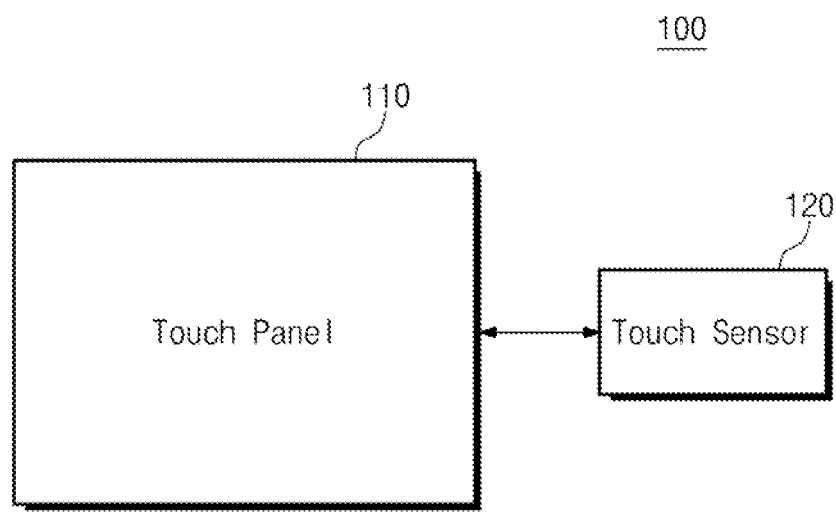
FIG. 1 is a block diagram illustrating a touch sensing device according to an embodiment of the inventive concept.

Exemplary embodiments of the inventive concept will hereafter be described with reference to the accompanying drawings. However, the inventive concept may be embodied in different forms and should not be construed as limited to the embodiments set forth herein. In the drawings, the thickness of layers and regions may be exaggerated for clarity.

As used herein, the singular forms, "a", "an" and "the" are intended to include both the singular and the plural forms, unless otherwise indicated herein or clearly contradicted by context.

Exemplary embodiment of the present inventive concept will be described here with reference to perspective views, cross-sectional views, and/or plan views. Thus, the profile of an exemplary view may be modified according to manufacturing techniques and/or allowances. The embodiments of the inventive concept are not intended to limit the scope of the present invention but are intended to cover all changes and modifications that can be caused due to a change in manufacturing process. Thus, regions shown in the drawings may be illustrated in schematic form and the shapes of the regions may be presented simply by way of illustration.

FIG. 1 is a block diagram illustrating a touch sensing device 100 according to an embodiment of the inventive concept. Referring to FIG. 1, the touch sensing device 100 includes a touch panel 110 and a touch sensor 120.

The touch panel 110 may output a signal that varies in response to a touch. The touch sensor 120 may control the touch panel 110 and senses the touch according to a change in the signal outputted from the touch panel 110.

For example, the touch sensing device 100 may be a capacitive-type sensing device. However, the touch sensing device 100 is not limited thereto. The touch sensing device 100 may be a transparent electrode-type or resistive-type sensing device.

Figure 2:
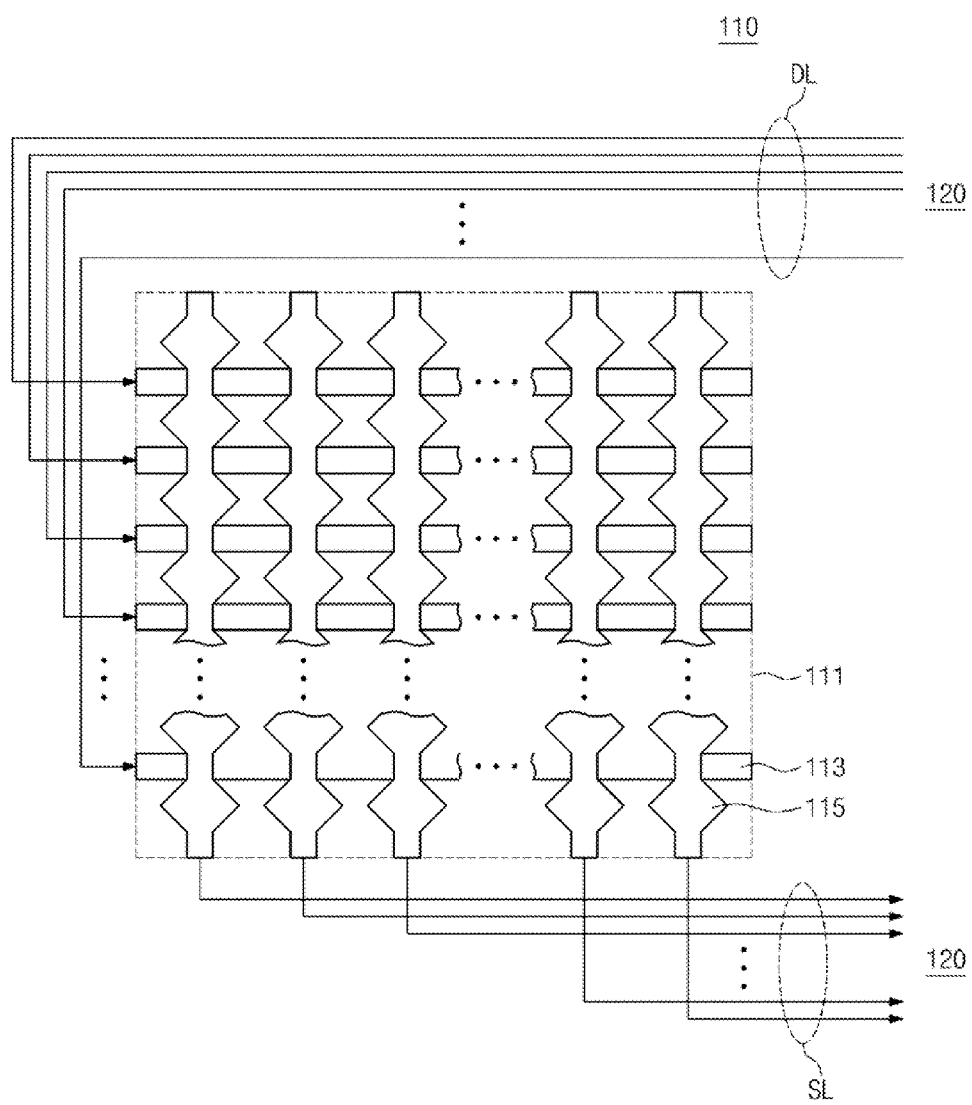
FIG. 2 illustrates a touch panel according to an embodiment of the present invention.

FIG. 2 illustrates the touch panel 110 according to an embodiment of the inventive concept. Referring to FIGS. 1 and 2, the touch panel 110 may include first conductive lines 113 and second conductive lines 115 arranged in a touch region 111.

The first conductive lines 113 may be arranged in parallel in a horizontal direction in the touch region 111. The second conductive lines 115 may be arranged in parallel in a vertical direction in the touch region 111. The second conductive lines 115 may be arranged on the first conductive lines 113. The first and second conductive lines 113 and 115 may be electrically insulated.

The second conductive lines 115 may have a specific pattern. For example, as illustrated in FIG. 2, the second conductive lines 115 may have a pattern of repeated rhombuses. However, the pattern of the second conductive lines 115 is not limited to that illustrated in FIG. 2.

The first conductive lines 113 may be respectively connected to a plurality of driving lines DL. The second conductive lines 115 may be respectively connected to a plurality of sensing lines SL. The driving lines DL and the sensing lines SL may be connected to the touch sensor 120.

Figure 3:
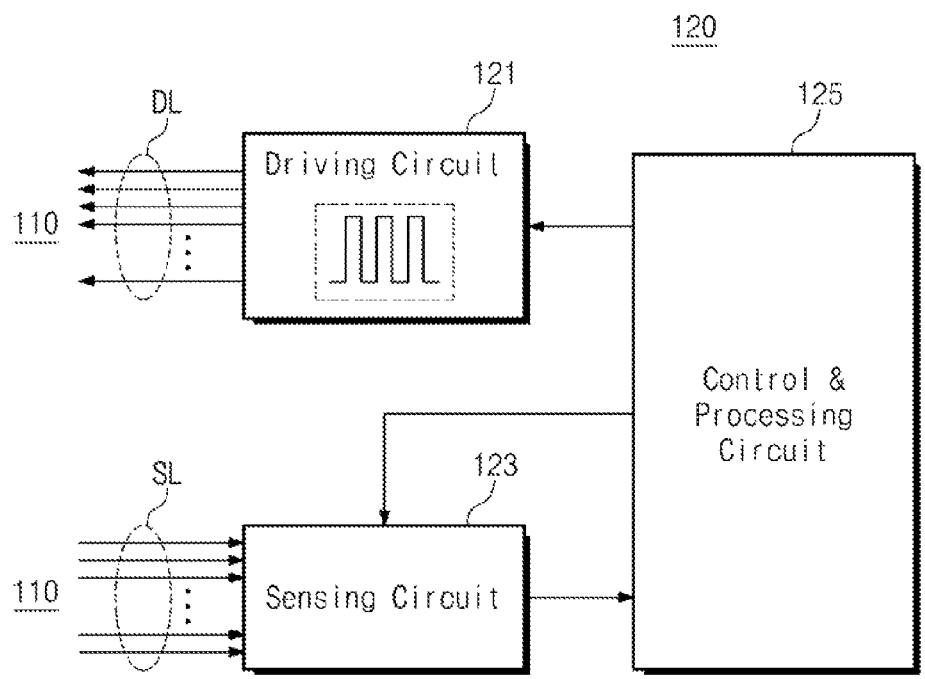
FIG. 3 is a block diagram illustrating a touch sensor according to an embodiment of the inventive concept.

FIG. 3 is a block diagram illustrating the touch sensor 120 according to an embodiment of the inventive concept. Referring to FIGS. 1 to 3, the touch sensor 120 may include a driving circuit 121, a sensing circuit 123, and a control and processing circuit 125.

The driving circuit 121 may be connected to the driving lines DL. The driving circuit 121 may apply a voltage to the driving lines DL according to a control signal by the control and processing circuit 125. For example, the driving circuit 121 may supply the driving lines DL with a pulse signal including a series of sequential pulses.

The sensing circuit 123 may be connected to the sensing lines DL. The sensing circuit 123 may sense signals transferred through the sensing lines SL according to a control signal by the control and processing circuit 125. The sensing circuit 123 may convert the sensed signal into a digital signal. The digital signal may be transferred to the control and processing circuit 125.

The control and processing circuit 125 may control the driving circuit 121 and the sensing circuit 123. The control and processing circuit 125 may determine whether a touch occurs on the touch panel 110 and may determine a location of the touch event on the touch panel 110, in response to a signal received from the sensing circuit 123.

Figure 4:
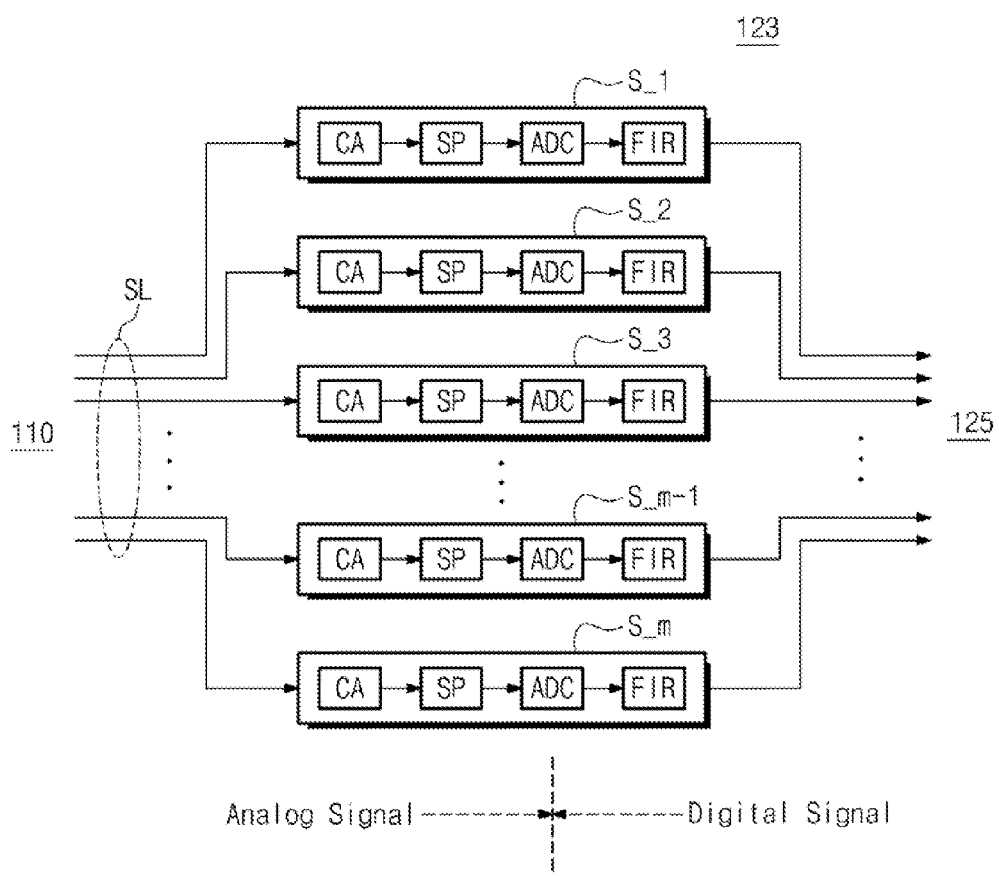
FIG. 4 is a block diagram illustrating a sensing circuit according to an embodiment of the inventive concept.

FIG. 4 is a block diagram illustrating the sensing circuit 123 according to an embodiment of the inventive concept. Referring to FIGS. 3 and 4, the sensing circuit 123 includes a plurality of sensing units S_1 to S_m.

Each of the sensing units S_1 to S_m may include a charge amplifier CA, a signal processor SP, an analog-to-digital converter ADC, and a digital filter.

The charge amplifier CA is configured to convert a current signal received through the sensing line SL into a voltage signal.

The signal processor SP is configured to process an output signal of the charge amplifier CA. For example, the signal processor SP may demodulate and filter the output signal of the charge amplifier CA. The signal processor SP may convert the output signal of the charge amplifier CA into a direct current (DC) signal.

The analog-to-digital converter ADC is configured to convert an output signal of the signal processor SP into a digital signal.

The digital filter may be a finite-impulse-response (FIR) filter, but the digital filter is not limited thereto. The digital filter is configured to filter the digital signal sampled through the analog-to-digital converter ADC. The digital signal outputted from the digital filter may be transferred to the control and processing circuit 125.

For example, the charge amplifier CA and the signal processor SP may process analog signals, and the digital filter may process digital signals.

Figure 5:
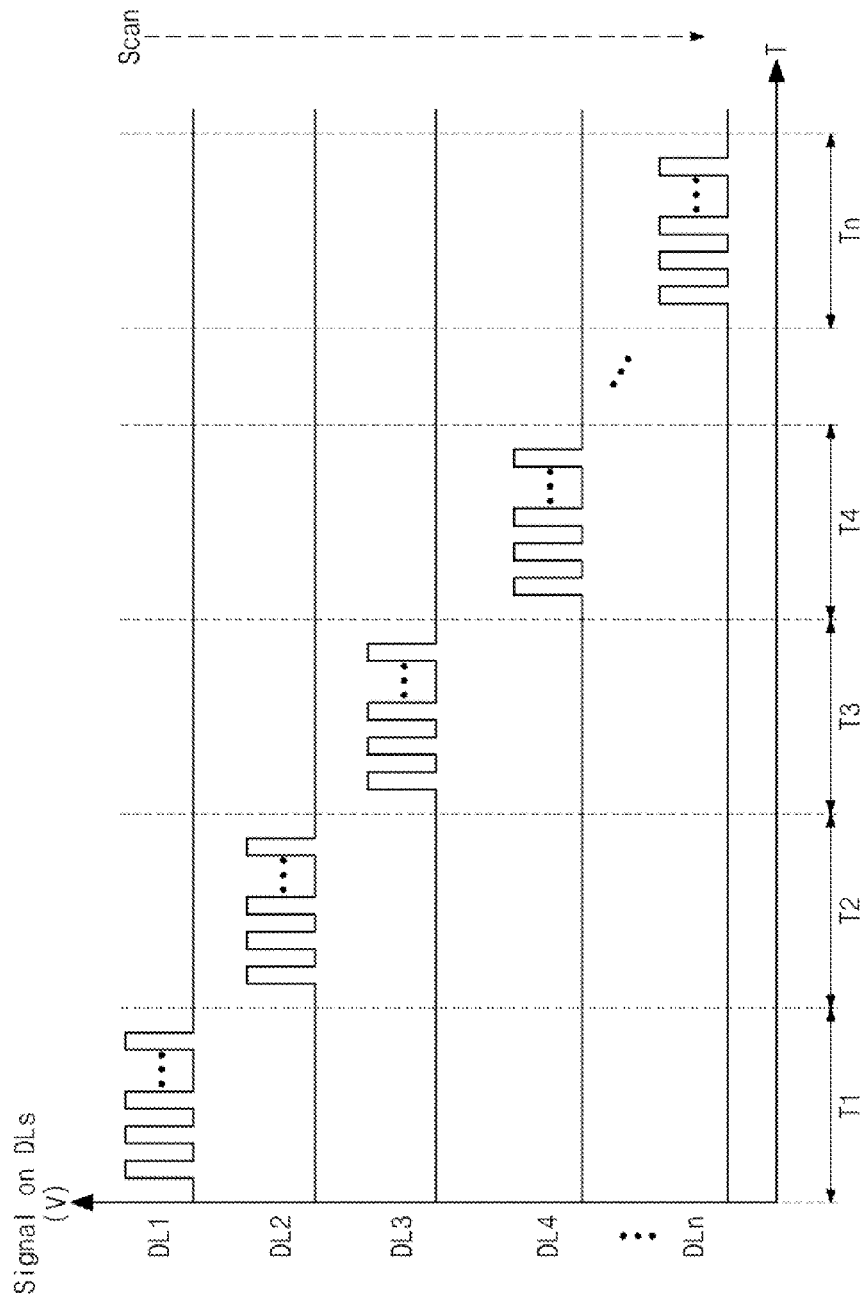
FIG. 5 is a timing diagram illustrating exemplary pulse signals transferred from a driving circuit to driving lines.

FIG. 5 is a timing diagram illustrating exemplary pulse signals transferred from the driving circuit 121 to the driving lines DL. Referring to FIGS. 1 to 5, the driving circuit 121 may sequentially output pulse signals to first to n-th driving lines DL1 to DLn.

At a first interval T1, the driving circuit 121 is configured to output a pulse signal to the first driving line DL1, The driving circuit 121 is configured not to output pulse signals to the other driving lines DL2 to DLn. The pulse signal provided to the first driving line DL1 may be transferred to the sensing lines SL by a coupling phenomenon. The sensing circuit 123 may receive the pulse signal through the sensing lines SL. The driving lines DL1 to DLn may be connected to the first conductive lines 113 in the touch region 111, and the sensing lines SL may be connected to the second conductive lines 115 in the touch region 111. The sensing circuit 123 and the control and processing circuit 125 may determine, based on signals received through the sensing lines SL, whether a touch occurs in a region adjacent to the first conductive line connected to the first driving line DL1 in the touch region 111. For example, when a signal of a sensing line among the sensing lines SL is changed, it may be determined that a touch has occurred at a part of the touch region 111 which corresponds to the first driving line DL 1 and the sensing line.

At a second interval T2, the driving circuit 121 outputs a pulse signal to the second driving line DL2, but the driving circuit 121 does not output pulse signals to the other driving lines DL1, and DL3 to DLn. The pulse signal provided to the second driving line DL2 may be transferred to the sensing lines SL by a coupling phenomenon. The sensing circuit 123 may receive the pulse signal through the sensing lines SL. The sensing circuit 123 and the control and processing circuit 125 may determine, based on the signals received through the sensing lines SL, whether a touch occurs in a region adjacent to the first conductive line connected to the second driving line DL2 in the touch region 111. For example, when a signal of a sensing line among the sensing lines SL is changed, it may be determined that a touch has occurred at a part of the touch region 111 which corresponds to the second driving line DL2 and the sensing line.

As the pulse signals are sequentially provided to the driving lines DL1 to DLn, it may be sequentially determined whether touches occur at parts of the touch regions 111 which correspond to the driving lines DL1 to DLn. The operation of sequentially providing the pulse signals to the driving lines DL1 to DLn may be a sequential scanning operation for determining whether a touch occurs in the touch region 111.

Figure 6:
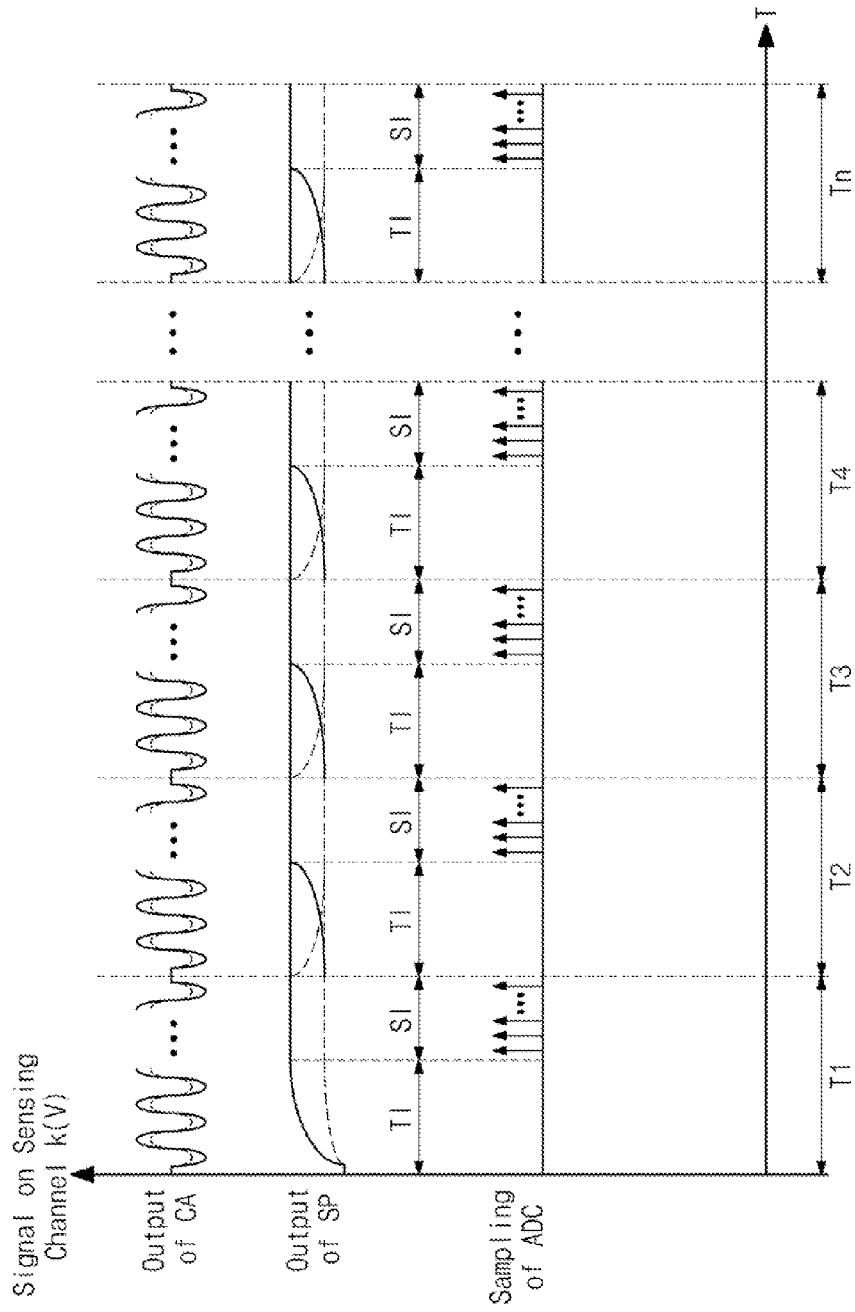
FIG. 6 is a timing diagram illustrating exemplary signals received by a sensing circuit from sensing lines.

FIG. 6 is a timing diagram illustrating exemplary signals received by the sensing circuit 123 from the sensing lines SL. FIG. 6 exemplarily illustrates a signal that is received by a k-th sensing unit S_k through a k-th sensing line SLk among the plurality of sensing lines.

Referring to FIGS. 1 to 6, at a first interval T1, the pulse signal outputted to the first driving line DL1 may be transferred to the sensing lines SL by a coupling phenomenon. The k-th sensing unit S_k may receive a signal from the k-th sensing line SLk. The charge amplifier CA may convert a current signal received through the k-th sensing line SLk into a voltage signal. For example, since a swing pulse signal is supplied to the first driving line DL1, an output signal of the charge amplifier CA may also be a swing signal.

For example, when a touch does not occur at a part of the touch region 111 which corresponds to the first driving line DL1 and the k-th sensing line SLk, the output signal of the charge amplifier CA may have the shape indicated by the solid line, as shown in FIG. 6. However, when the touch occurs, capacitance between the first driving line DL1 and the k-th sensing line SLk may change, and thus the output signal of the charge amplifier CA may have the shape indicated by the dotted line.

The signal processor SP may rectify the output signal of the charge amplifier CA so as to make the signal have a uniform phase. For example, the signal processor SP may invert a negative-phase part of the output signal of the charge amplifier CA to make the signal have a uniform positive phase, vice versa. The signal with the uniform positive phase may be demodulated and filtered by a low-pass filter. The output signal of the low-pass filter may be a DC signal.

The output signal of the signal processor SP may have a transient interval TI and a stable interval SI. In the transient interval TI, a level of the output signal may rise or fall, but may approach a flat level, DC level. In the stable interval SI, the level of the output signal may reach the DC level.

For example, when a touch does not occur at a part of the touch region 111 which corresponds to the first driving line DL1 and the k-th sensing line SLk, the output signal of the signal processor SP may have the shape indicated by the solid line, as shown in FIG. 6. However, when the touch occurs, the capacitance between the first driving line DL1 and the k-th sensing line SLk changes, and thus the output signal of the signal processor SP may have the shape indicated by the dotted line, as shown in FIG. 6.

The analog-to-digital converter ADC may sample the output signal of the signal processor SP. For example, the analog-to-digital converter ADC may not perform the sampling when the output signal of the signal processor SP is in the transient interval TI, and may perform the sampling when the output signal of the signal processor SP is in the stable interval SI.

At a second interval T2, the pulse signal outputted to the second driving line DL2 may be transferred to the sensing lines SL by a coupling phenomenon. The k-th sensing unit S_k may receive a signal from the k-th sensing line SLk. The charge amplifier CA may convert a current signal received through the k-th sensing line SLk into a voltage signal. The signal processor SP may output a signal having a DC level. The analog-to-digital converter ADC may perform a digital sampling the signal having the DC level. When a touch does not occur, the signal may have the shape indicated by the solid line, as shown in FIG. 6. When the touch occurs, the signal may have the shape indicated by the dotted line, as shown in FIG. 6.

For example, when the touch occurs during the first interval T1 and is released at the second interval T2, the output signal of the signal processor SP may increase in the transient interval TI of the first interval T1 and reach the lower DC level in the stable interval SI of the first interval T1 (see, for example, the dotted line in the first interval T1 of FIG. 6). In the second interval T2, the signal having the lower DC level may increase in the transient interval TI and reach the higher DC level in the stable interval SI (see, for example, the solid line in the second interval T2 of FIG. 6). When the touch does not occur during the first interval T1 but occurs at the second interval T2, the output signal of the signal processor SP may increase in the transient interval TI of the first interval T1 and reach the higher DC level in the stable interval SI of the first interval T1 (see, for example, the solid line in the first interval T1 of FIG. 6). In the second interval T2, the signal having the higher DC level may decrease in the transient interval TI and reach the lower DC level in the stable interval SI (see, for example, the dotted line in the second interval T2 of FIG. 6). When the touch does not occur at the first and second intervals T1 and T2, the output signal of the signal processor SP may maintain a higher DC level (see, for example, solid line in the first interval T1 and second intervals T2).

Similarly, in the third T3 to n-th intervals Tn, the signal processor SP may output the signals indicated by the solid line or dotted line, as illustrated in FIG. 6, according to whether a touch occurs. The output signal of the signal processor SP may be sampled by the analog-to-digital converter ADC.

Figure 7:
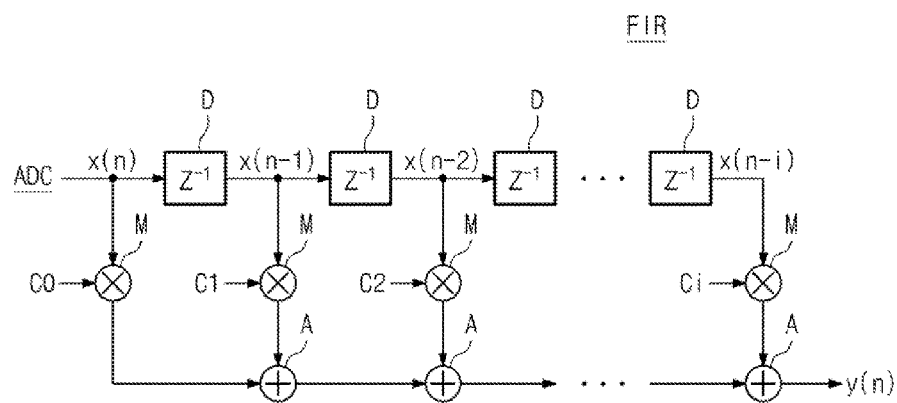
FIG. 7 is a schematic diagram illustrating a final impulse response filter.

FIG. 7 is a schematic diagram illustrating a digital filter FIR. The digital filter FIR may be a finite-impulse-response (FIR) filter, but the digital filter FIR is not limited thereto. Referring to FIG. 7, the digital filter FIR may include a plurality of delayers D, a plurality of multipliers M, and a plurality of adders A.

The plurality of delayers D is configured to delay input samples and output the delayed input samples. The plurality of multiplier is configured to multiply the digital samples or the delayed digital samples, by filter coefficients C0 to Ci. The digital samples may be the digital signals converted and sampled by the analog-to-digital converter ADC. The plurality of adders A is configured to add the output signals of the plurality of multipliers M.

The digital filter FIR may operate in response to a clock signal. The plurality of delayers D, the plurality of multipliers M, and the plurality of adders A may operate in response to the clock signal.

The digital filter FIR may output signals as shown in Table 1.

TABLE 1

| Clock | Output signal | State |
|---|---|---|
| 1 | y(n) = C0 · x(n) | Transient response |
| 2 | y(n) = C0 · x(n) + C1 · x(n − 1) | Transient response |
| 3 | y(n) = C0 · x(n) + C1 · x(n − 1) + C2 · x(n − 2) | Transient response |
| ... | ... | ... |
| i | y(n) = C0 · x(n) + C1 · x(n − 1) + C2 · x(n − 2) + ... + C(i − 1) · x(n − (i − 1)) | Transient response |

TABLE 1-continued

| Clock | Output signal | State |
|---|---|---|
| i + 1 | y(n) = C0 · x(n) +<br>C1 · x(n − 1) +<br>C2 · x(n − 2) + . . . +<br>C(i − 1) · x(n − (i − 1)) +<br>Ci · x(n − i) | Stable response |

Referring to Table 1, the number of the filter coefficients C0 to Ci may be i+1. The digital filter FIR may output a transient response until an i-th clock is inputted, and may output a stable response from when an (i+1)-th clock is inputted. When 1 to i-th clocks are inputted, the output signals of the digital filter FIR may be ignored. When the (i+1)-th clock is inputted, the digital filter FIR may output a valid filtered value.

Figure 8:
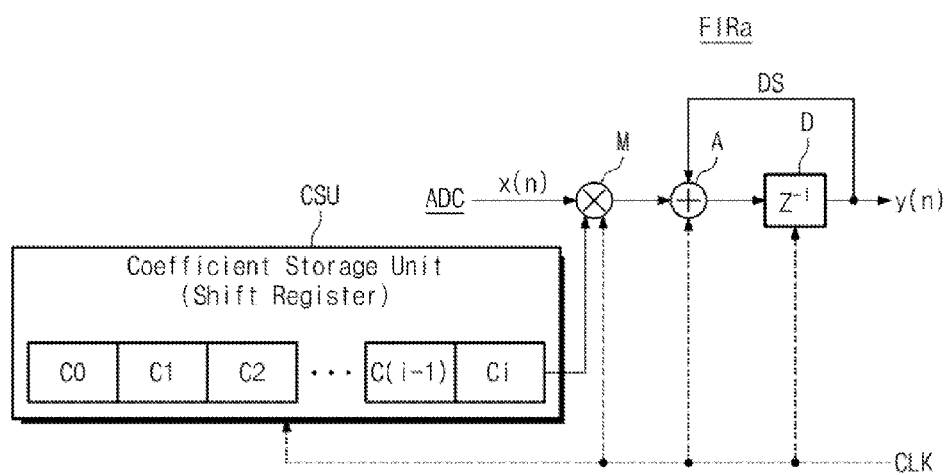
FIG. 8 is a schematic diagram of a digital filter, according to an embodiment of the inventive concept.

FIG. 8 is a schematic diagram illustrating a digital filter FIRa according to an embodiment of the inventive concept. Referring to FIG. 8, the digital filter FIRa may include a multiplier M, an adder A, a delayer D, and a coefficient storage unit CSU.

The multiplier M is configured to multiply the digital samples transferred from the analog-to-digital converter ADC and the filter coefficients C0 to Ci. The multiplier M may perform an operation, in response to a clock signal CLK.

The adder A is configured to add the output signal of the multiplier M and a delayed signal DS generated by delaying the output signal of the adder, in response to the clock signal CLK.

The delayer D is configured to delay the output signal of the adder A and output the delayed signal DS, in response to the clock signal CLK. The delayer D may output '0' or 'null' as an initial value.

The coefficient storage unit CSU may store the plurality of filter coefficients C0 to Ci. The coefficient storage unit CSU may sequentially select and output the filter coefficients from the first filter coefficient C0 to the last filter coefficient Ci, in response to the clock signal CLK. For example, the coefficient storage unit CSU may be a shift register that outputs a filter coefficient stored in a location, but the coefficient storage unit CSU is not limited to thereto.

The output signal of the delayer D may be an output signal of the digital filter FIRa. The output signal of the digital filter FIRa may be different from the output signal of the filter FIR (see FIG. 7). However, the digital filter FIRa may output the same output signal as the filter FIR at a time and invalid filtered values at other times. The digital filter FIRa may require less multiplier, adder, and delayer than the digital filter FIR. To obtain the valid filtered value at the time, the digital filter FIRa may be implemented with lower complexity and smaller size than those of the digital filter FIR.

The digital filter FIRa may output signals according to the clock as shown in Table 2.

TABLE 2

| Clock | Output signal | State |
|---|---|---|
| 1 | y(n) = Ci · x(n) | Invalid state |
| 2 | y(n) = C(i − 1) · x(n) +<br>Ci · x(n − 1) | Invalid state |
| 3 | y(n) = C(i − 2) · x(n) +<br>C(i − 1) · x(n − 1) +<br>Ci · x(n − 2) | Invalid state |
| . . . | . . . | . . . |
| i | y(n) = C1 · x(n) + . . . +<br>C(i − 2) · x(n − (i − 3)) +<br>C(i − 1) · x(n − (i − 2)) +<br>Ci · x(n − (i − 1)) | |
| i + 1 | y(n) = C0 · x(n) +<br>C1 · x(n − 1) + . . . +<br>C(i − 2) · x(n − (i − 2)) +<br>C(i − 1) · x(n − (i − 1)) +<br>Ci · x(n − i) | Valid state<br>(filtered value) |

Referring to Table 2, the number of the filter coefficients C0 to Ci may be i+1. Here, the digital filter FIRa may output an invalid response until an i-th clock is inputted, and may output a valid response at an (i+1)th clock. Only an output signal of the filtered value extractor FIRa obtained when the (i+1)th clock is inputted may be used as the filtered value.

Referring to TABLES 1 and 2, when the first to i-th clock signals are inputted, the digital filter FIR and the digital filter FIRa may output different values from each other. When the (i+1)th clock signal is inputted, the digital filter FIR and the digital filter FIRa may output the same value. After the (i+1)th clock, the digital filter FIR and the digital filter FIRa may output different values.

The digital filter FIRa may be a one-point filtered value extractor configured to extract the same output signal as that of the filter FIR at a clock time.

For example, as illustrated in FIG. 6, an interval where the analog-to-digital converter ADC may perform sampling may be limited to the stable interval SI. The number of samples outputted by the analog-to-digital converter ADC may be limited. The limited number of samples outputted by the analog-to-digital converter ADC may limit the number of stable response samples outputted by the digital filter FIR. For example, when the number of samples outputted by the analog-to-digital converter ADC is i+1, the filter digital FIR may output only one stable response sample as the digital filter FIRa does. As such, the digital filter FIR and the digital filter FIRa may not result different performance when each of the digital filter FIR and the digital filter FIRa is implemented to the sensing circuit 123. A touch sensing device implemented using the digital filter FIRa according to an embodiment of the inventive concept may have the same performance as a touch sensing device implemented using the digital filter FIR. The touch sensing device implemented using the digital filter FIRa may have lower complexity and a smaller size than the touch sensing device implemented using the digital filter FIR.

The number of samples outputted by the analog-to-digital converter (ADC) may be i+2 or more. The digital filter FIR may output two or more stable response samples. The analog-to-digital converter ADC may sample a DC level outputted from the signal processor SP. The output signal of the analog-to-digital converter ADC may be the DC level. The digital filter FIR may be a low pass filter. The digital filter FIR may pass a DC component while suppressing noises at high frequency range. Since the levels of output samples of the digital filter FIR indicate low-pass-filtered DC, the stable response samples of the digital filter FIR may have the same or similar values. The digital filter FIRa may result the same or similar filtering effect as that of the filter FIR.

Figure 9:
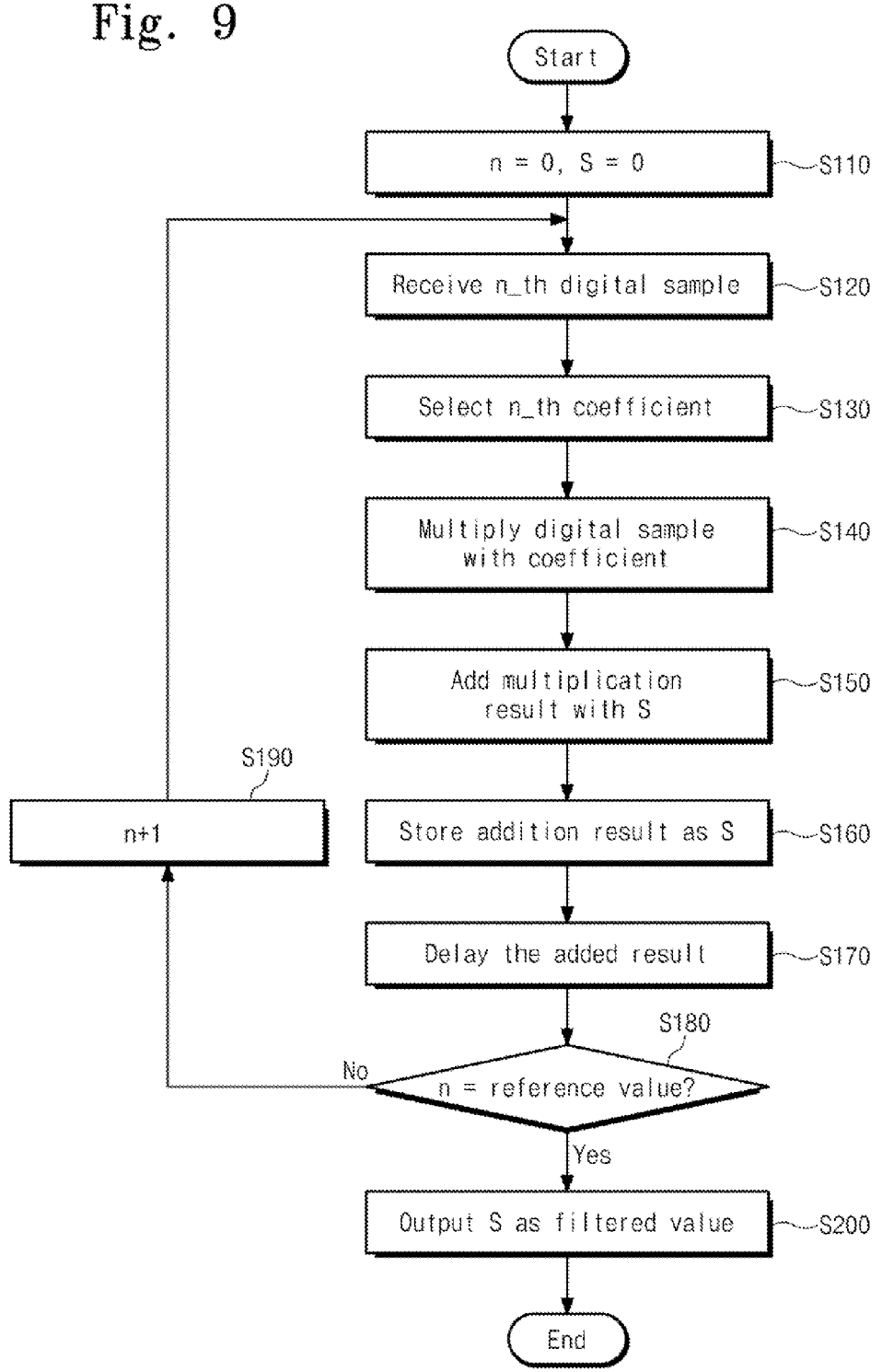
FIG. 9 is a flowchart illustrating a method for performing digital filtering, according to an embodiment of the inventive concept.

FIG. 9 is a flowchart illustrating a method for performing digital filtering according to an embodiment of the inventive concept. Referring to FIGS. 8 and 9, in an operation S110, a sample variable n and an addition variable S are initialized. Both of the sample variable n and the addition variable S may be initialized to 0.

In an operation S120, a digital sample corresponding to the sample variable n is received. The digital sample may be received from the analog-to-digital converter ADC.

In an operation S130, a filter coefficient corresponding to the sample variable n is selected. The coefficient storage unit CSU may select a filter coefficient from among the stored filter coefficients Ci to C0, corresponding to the clock signal CLK.

In an operation S140, the received digital sample and the selected filter coefficient is multiplied by the multiplier M.

In an operation S150, the multiplied result is added to the addition variable S through the adder A.

In an operation S160, the added result is delayed through the delayer D by one clock time.

In an operation S170, the delayed result is stored to the addition variable S.

In an operation S180, the sample variable is compared to a reference value. The reference value may be a clock value at which the digital filter FIRa outputs a valid filtered value.

When the sample variable n is not the same as the reference value, the sample variable n is increased by one in an operation S190. The operations of S120 to S180 may be repeated When the sample variable n is the same as the reference value, the addition variable S is outputted as a filtered value in operation S200.

Figure 10:
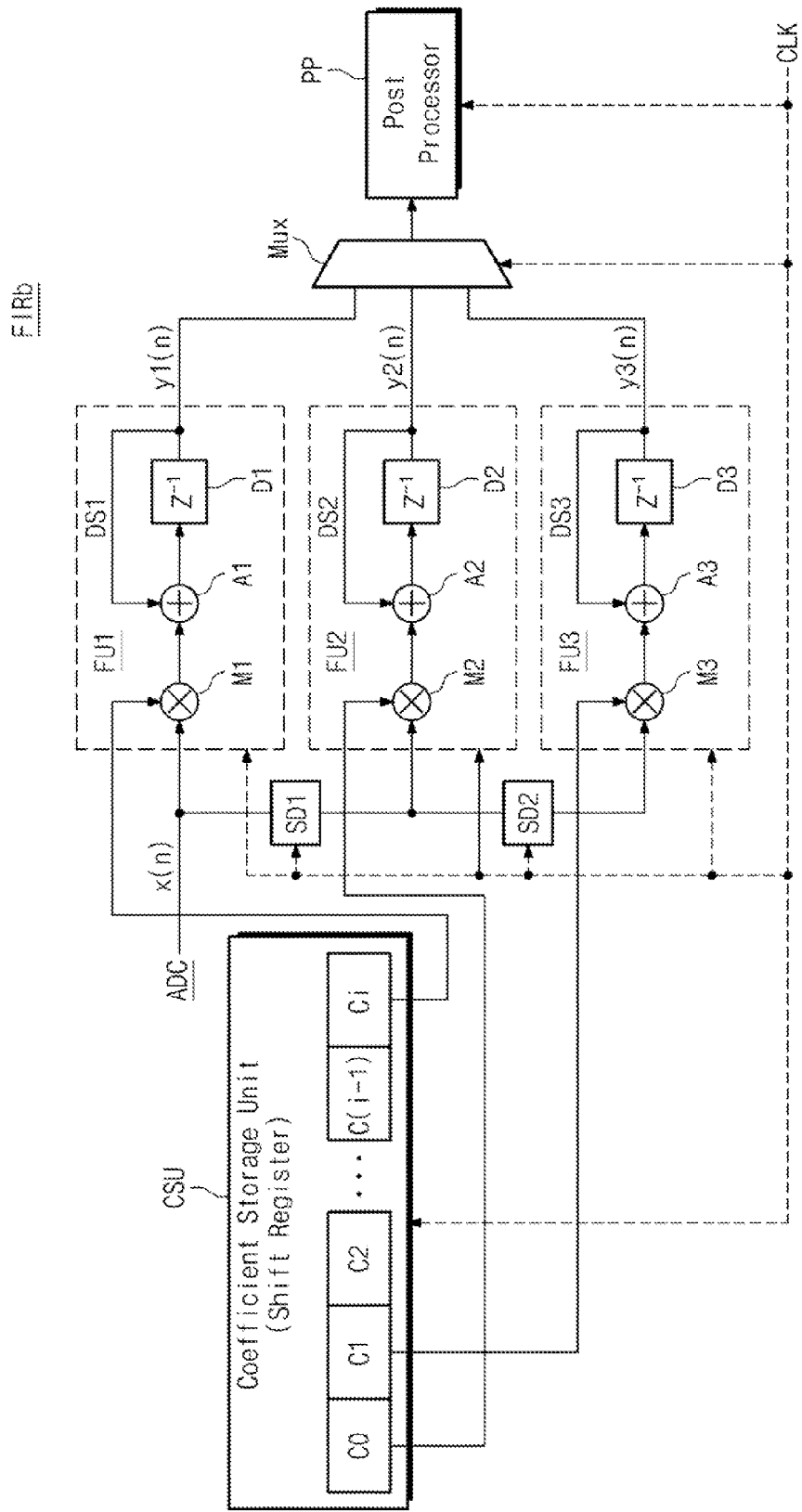
FIG. 10 is a schematic diagram illustrating a digital filter according to an embodiment the inventive concept.

FIG. 10 is a schematic diagram illustrating a digital filter FIRb according to an embodiment of the inventive concept. Referring to FIG. 10, the digital filter FIRb may include first to third filter units FU1 to FU3, sample droppers SD1 and SD2, a multiplexer MUX, a post-processor PP, and a coefficient storage unit CSU, but the digital filter is not limited thereto. The number of filter units, sample droppers, multiplexers, post-processor, and coefficient storage units CSU are not limited thereto.

The first filter unit FU1 may include a multiplier M1, an adder A1, and a delayer D1. The first filter unit FU1 may operate in response to the clock signal CLK. The multiplier M1 is configured to multiply input digital samples by filter coefficients respectively. The adder A1 is configured to add the output signal of the multiplier M1 and a delayed signal DS1. The delayed signal DS1 is generated by delaying the output signal of the adder A1. The delayer D1 is configured to delay the output signal of the adder A1 and output the delayed signal. The output signal of the delayer D1 may be transferred, as an output signal y1(n) of the filter unit FU1, to the multiplexer. The first filter unit FU1 may output a valid filtered value at a specific time.

The sample dropper SD1 is configured to receive input digital samples from the analog-to-digital converter ADC. The sample dropper SD1 may ignore a first input digital sample and may pass a second input sample and samples following the second sample in response to a clock signal CLK.

The second filter unit FU2 may include a multiplier M2, an adder A2, and a delayer D2. The second filter unit FU2 may operate in response to the clock signal CLK. The multiplier M2 is configured to multiply output digital samples of the sample dropper SD1 by the filter coefficients respectively. The adder A2 is configured to add the output signal of the multiplier M2 and a delayed signal DS2. The delayer D2 delays an output signal of the adder A2 to output the delayed signal DS2. The delayed signal DS2 is generated by delaying the output signal of the adder A2. The delayer D2 is configured to delay the output signal of the adder A2 and output the delayed signal. The output signal of the delayer D2 may be transferred, as an output signal y2(n) of the filter unit FU2, to the multiplexer. The second filter unit FU2 may output a valid filtered value at a specific time later than the time at which the first filter unit FU1 outputs a valid filtered value.

The sample dropper SD2 is configured to receive output digital samples of the sample dropper SD1. The sample dropper SD2 may ignore a first sample of the output signal of the sample dropper SD1 and may pass a second sample and samples following the second sample of the output signal of the sample dropper SD1, in response to the clock signal CLK1.

The third filter unit FU3 may include a multiplier M3, an adder A3, and a delayer D3. The third filter unit FU3 may operate in response to the clock signal CLK. The multiplier M3 is configured to multiply output samples of the sample dropper SD2 by the filter coefficients respectively. The adder A3 is configured to add the output signal of the multiplier M3 and a delayed signal DS3. The delayed signal DS3 is generated by delaying the output signal of the adder A2. The delayer D3 is configured to delay the output signal of the adder A3 and output the delayed signal. The output signal of the delayer D3 may be transferred, as an output signal y3(n) of the filter unit FU3, to the multiplexer. The third filter unit FU3 may output a valid filtered value at a specific time later than the time at which the second filter unit FU2 outputs a valid filtered value.

The multiplexer is configured to receive the output signals y1(n) to y3(n) of the first to third filter units FU1 to FU3. The multiplexer may sequentially select the first to third output signals y1(n) to y3(n) in response to the clock signal. For example, the multiplexer may select the output signal y1(n) of the first filter unit FU1 at the time at which the first filter unit FU1 outputs a valid filtered value. The multiplexer may select the output signal y2(n) of the second filter unit FU2 at the time at which the second filter unit FU2 outputs a valid filtered value. The multiplexer may select the output signal y3(n) of the third filter unit FU3 at the time when the third filter unit FU3 outputs a valid filtered value.

The post-processor PP is configured to receive the output signals of the multiplexer and perform an operation on the received signals. For example, the post-processor PP may calculate an average (or a weighted average) for the received signals, and may select a calculated result as a final filtered value.

The coefficient storage unit CSU is configured to store the plurality of filter coefficients C0 to Ci. The coefficient storage unit CSU may provide different filter coefficients to the plurality of filter units FU1 to FU3. For example, the coefficient storage unit CSU may provide a (k+1)th filter coefficient C(k+1) and a (k+2)th filter coefficient C(k+2) to the second filter unit FU2 and the third filter unit FU3 respectively, while providing a k-th filter coefficient Ck to the first filter unit FU1.

The first filter unit FU1 may perform the operation on a first sample and samples following the first sample among the input digital samples received from the analog-to-digital converter ADC. The first filter unit FU1 may output a valid filtered value when an (i+1)th input sample is received.

The second filter unit FU2 may perform the operation on a second sample and samples following the second sample among the input digital samples received from the analog-to-digital converter ADC. The second filter unit FU2 may output a valid filtered value when an (i+2)th input sample is received.

The third filter unit FU3 may perform the operation on a third sample and sample following the third sample among the input samples transferred from the analog-to-digital converter ADC. The third filter unit FU3 may output a valid filtered value when an (i+3)th input sample is received.

When the filter units FU1 to FU3 are arranged in parallel through the sample droppers SD1 and SD2, as illustrated in FIG. 10, an operation may generate successive filtered values. The successive filtered values may be the same as the stable response samples of the digital filter FIR of FIG. 7.

As illustrated in FIGS. 7 and 10, the 3-point digital filter (may be called 3-point filtered value extractor) may have lower complexity and smaller size than those of the digital filter FIR according to an illustrated filter in FIG. 7. When the digital filter FIRb according to an embodiment of the inventive concept is used, a touch sensing device having low complexity and small size may be provided, without degrading the performance of the touch sensing device.

In the case where a limited number of stable response samples are required in a device such as a touch sensing device with limited samples, or in the case where stable response samples have the same values, the digital filter FIRa or FIRb according to an embodiment of the inventive concept may have low complexity and small size, maintaining the same or similar performance with the digital filter FIR.

Figure 11:
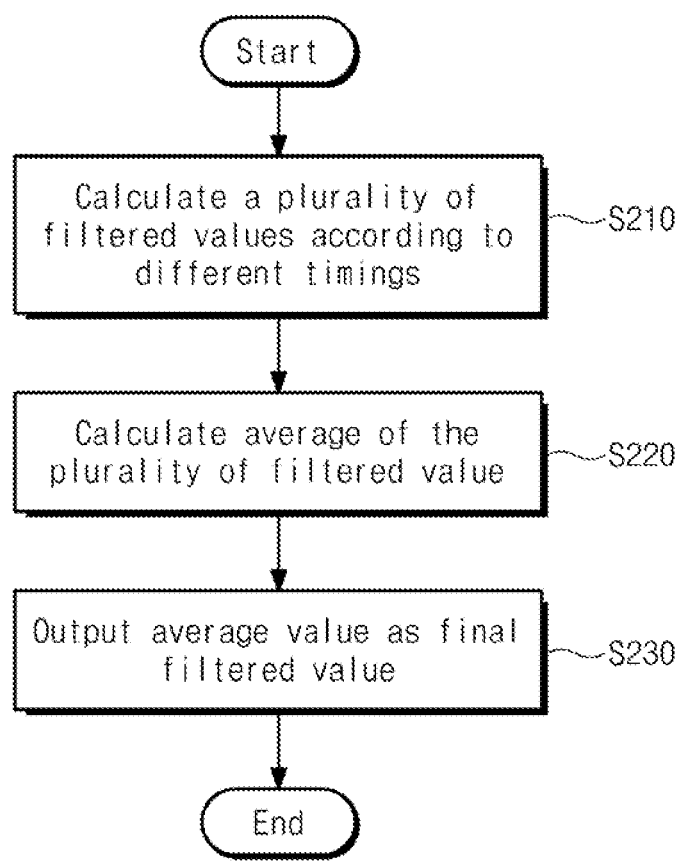
FIG. 11 is a flowchart illustrating a method for performing digital filtering according to an embodiment of the inventive concept.

FIG. 11 is a flowchart illustrating a method for performing digital filtering according to an embodiment of the inventive concept. Referring to FIGS. 10 and 11, in an operation S210, a plurality of filtered values is calculated according to different times. The plurality of filtered values may be received from the filter units (FU1, FU2, FU3). For example, the first filter unit FU1 may calculate a valid filtered value at a first time, the second filter unit FU2 may calculate a valid filtered value at a second time later than the first time, and the third filter unit FU3 may calculate a valid filtered value at a third time later than the second time. However, the number of filtered values and the filter units providing the filter values are not limited thereto.

In an operation S220, an average of the plurality of filtered values is calculated through the post-processor PP. The calculation may be a weighted average.

In an operation S230, the calculated final value through the operation S220 is outputted as a final filtered value.

Figure 12:
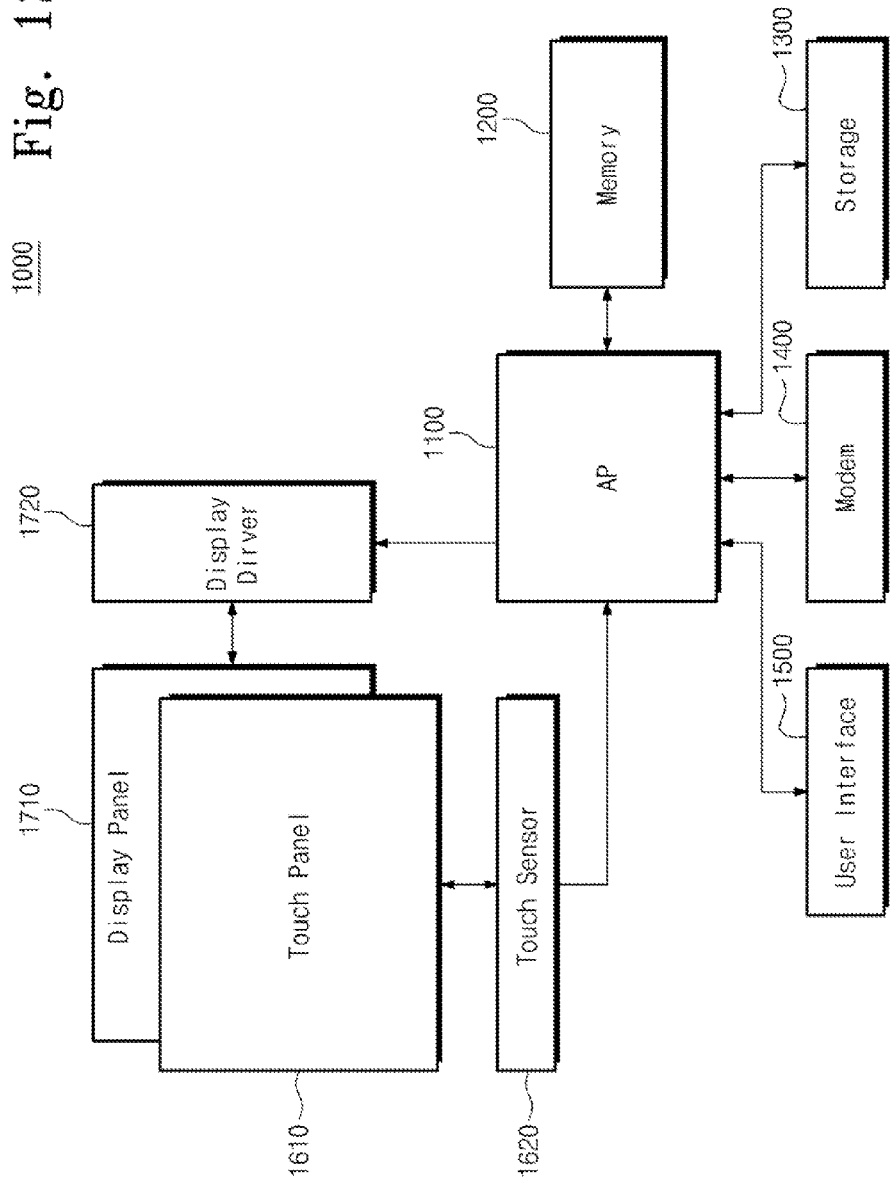
FIG. 12 is a block diagram illustrating a mobile device according to an embodiment of the inventive concept.

FIG. 12 is a block diagram illustrating a mobile device 1000 according to an embodiment of the inventive concept. Referring to FIG. 12, the mobile device 1000 may include an application processor 1100, a memory 1200, a storage 1300, a modem 1400, a user interface 1500, a touch panel 1610, a touch sensor 1620, a display panel 1710, and a display driver 1720.

The application processor 1100 may control an overall operation of the mobile device 1000 and may perform a logic operation.

The memory 1200 may be an operating memory of the application processor 1100. The memory 1200 may include a random-access memory (RAM). The memory 1200 may include a nonvolatile memory such as a phase-changed random-access memory (PRAM), a magnetoresistive random-access memory (MRAM), an ferroelectric random-access memory (FRAM), or a flash memory, or a volatile memory such as a dynamic random-access memory (DRAM) or an synchronous dynamic random-access memory (SDRAM). However, the memory 1200 is not limited thereto.

The storage 1300 may be an auxiliary storage of the mobile device 1000. The storage 1300 may include a nonvolatile memory. The storage 1300 may include a nonvolatile memory such as a flash memory, an MRAM, a PRAM, and an FRAM. The storage 1300 may include a hard disk drive (HDD). However, the storage 1300 is not limited thereto.

If the memory 1200 and the storage 1300 are the same type nonvolatile memories, the memory 1200 and the storage 1300 may be integrated into one element.

The modem 1400 may perform wired or wireless communication with others according to the control by the application processor 1100. The modem 1400 may perform communication according to wireless communication standards such as WiFi, long-term evolution (LTE), code-division-multiple-access (CDMA), global system for mobile communication (GSM), WiMAX, near-field communication (NFC), or Bluetooth, or wired communication standards such as USB, IEEE 1394 interface, PCI, serial advance technology attachment (SATA), or Ethernet. However, the modem 1400 is not limited thereto.

The user interface 1500 may exchange signals with a user according to the control by the application processor 1100. The user interface 1500 may include a user input interface such as a keyboard, a button, a microphone, and a camera, or a user output interface such as a speaker, a motor, and a lamp. However, the user interface 1500 is not limited thereto.

The touch panel 1610 and the touch sensor 1620 may correspond to the touch panel 110 and the touch sensor 120 described above with reference to FIGS. 1 and 2. The touch panel 1610 and the touch sensor 1620 may be included in the user interface 1500.

The display panel 1710 may be a display panel such as an LCD and an AMOLED. The display driver 1720 may drive the display panel. However, the display panel 1710 is not limited thereto. The display panel 1710 and the display driver 1720 may be included in the user interface 1500.

The touch panel 1610 and the display panel 1710 may have a multilayer structure. For example, the touch panel 1610 may be arranged on the display panel 1710.

The touch panel 1610 and the display panel 1710 may have a single-layer structure. For example, the touch panel 1610 and the display panel 1710 may be arranged on one substrate.

The above-disclosed subject matter is to be considered illustrative and not restrictive, and the appended claims are intended to cover all such modifications, enhancements, and other embodiments, which fall within the true spirit and scope of the inventive concept.

What is claimed is:

1. A touch sensing device comprising:
   a touch panel; and
   a touch sensor configured to control the touch panel and sense a touch signal through the touch panel,
   wherein the touch sensor comprises a plurality of sensing units connected to the touch panel through a plurality of sensing lines,
   wherein each of the plurality of sensing units comprises a digital filter configured to output a valid filtered value at a first time and invalid filtered values at other times by performing an operation on a plurality of input digital samples and a plurality of filter coefficients during a filtering operation of the plurality of input digital samples,
   wherein the plurality of input digital samples is generated from a signal received through each of the plurality of sensing lines, and
   wherein the other times include a time prior to the first time and a time following the first time.

2. The touch sensing device of claim 1, wherein each of the plurality of sensing units further comprises:
   a charge amplifier configured to convert the signal received through each of the plurality of sensing lines into a voltage signal;
   a signal processor configured to process an output signal of the charge amplifier; and
   an analog-to-digital converter configured to convert an output signal of the signal processor into the plurality of input digital samples.

3. The touch sensing device of claim 1, wherein the plurality of filter coefficients is selected sequentially by a coefficient storage unit.

4. The touch sensing device of claim 1, wherein the output signal of the delayer generates the valid filtered value at a time when the number of inputted clock is the same as the number of the plurality of filter coefficients.

5. The touch sensing device of claim 1, wherein each of the plurality of sensing units further comprises:
   a second multiplier configured to multiply each of the samples outputted from the sample dropper and each of the plurality of filter coefficients;
   a second adder configured to add an output signal of the second multiplier and a second delayed signal generated by delaying an output signal of the second adder; and
   a second delayer configured to delay the output signal of the second adder and output the second delayed signal.

6. The touch sensing device of claim 5, wherein each of the plurality of sensing units further comprises:
   a second sample dropper configured to ignore a first sample of the output signal of the sample dropper, and output a second sample of the output signal of the sample dropper, and samples following the second sample of the output signal of the sample dropper;
   a third multiplier configured to multiply each of the samples outputted from the second sample dropper and each of the plurality of filter coefficients;
   a third adder configured to add an output signal of the third multiplier and a third delayed signal generated by delaying an output signal of the third adder; and
   a third delayer configured to delay the output signal of the third adder and output the third delayed signal.

7. The touch sensing device of claim 6, the filter coefficients multiplied to each of the samples through the multiplier, the second multiplier, and the third multiplier are different from each other.

8. The touch sensing device of claim 6, wherein the third delayer generates a third valid filtered value at a time later than the time at which the second delayer generates a second valid filtered value.

9. The touch sensing device of claim 6, wherein each of the plurality of sensing units further comprises:
   a multiplexer configured to sequentially select the output signals of the delayer, the second delayer, the third delayer; and
   a post-processor configured to calculate an average of output signals of the multiplexer.

10. The touch sensing device of claim 5, wherein the second delayer generates a second valid filtered value at a time later than the time at which the delayer generates the valid filtered value.

11. A digital filter comprising:
   a multiplier configured to multiply each of a plurality of input digital samples and each of a plurality of filter coefficients;
   an adder configured to add an output signal of the multiplier and a delayed signal generated by delaying an output signal of the adder;
   a delayer configured to delay the output signal of the adder and output the delayed signal; and
   a sample dropper configured to ignore a first sample of the plurality of input digital samples, and output a second sample and samples following the second sample.

12. The digital filter of claim 11, wherein the delayer generates a valid filtered value at a time and invalid filtered values at other times.

13. The digital filter of claim 12, wherein the time at which the delayer generates the valid filtered value is when the number of inputted clock is the same as the number of the plurality of filter coefficients.

14. The digital filter of claim 11, further comprising:
   a second multiplier configured to multiply each of the samples outputted from the sample dropper and each of the plurality of filter coefficients;
   a second adder configured to add an output signal of the second multiplier and a second delayed signal generated by delaying an output signal of the second adder; and
   a second delayer configured to delay the output signal of the second adder and output the second delayed signal.

15. The digital filter of claim 14, further comprising:
   a second sample dropper configured to ignore a first sample of the output signal of the sample dropper, and output a second sample of the output signal of the sample dropper, and samples following the second sample of the output signal of the sample dropper;
   a third multiplier configured to multiply each of the samples outputted from the second sample dropper and each of the plurality of filter coefficients;
   a third adder configured to add an output signal of the third multiplier and a third delayed signal generated by delaying an output signal of the third adder; and
   a third delayer configured to delay the output signal of the third adder and output the third delayed signal.

16. The digital filter of claim 15, the filter coefficients multiplied to each of the samples at the multiplier, the second multiplier, and the third multiplier are different from each other.

17. The digital filter of claim 15, further comprising:
   a multiplexer configured to sequentially select the output signals of the delayer, the second delayer, and the third delayer; and
   a post-processor configured to calculate an average of output signals of the multiplexer.

* * * * *